(12) United States Patent
Milanesi

(10) Patent No.: US 12,249,826 B2
(45) Date of Patent: Mar. 11, 2025

(54) CURRENT LIMITED POWER DEVICE

(71) Applicant: NXP USA, Inc., Austin, TX (US)

(72) Inventor: Andrea Milanesi, Milan (IT)

(73) Assignee: NXP USA, Inc., Austin, TX (US)

( * ) Notice: Subject to any disclaimer, the term of this patent is extended or adjusted under 35 U.S.C. 154(b) by 180 days.

(21) Appl. No.: 17/937,648

(22) Filed: Oct. 3, 2022

(65) Prior Publication Data

US 2024/0128743 A1 Apr. 18, 2024

(51) Int. Cl.
*H02H 9/02* (2006.01)
*H02H 1/00* (2006.01)
*H02M 3/155* (2006.01)

(52) U.S. Cl.
CPC ............ *H02H 9/02* (2013.01); *H02H 1/0007* (2013.01); *H02M 3/155* (2013.01)

(58) Field of Classification Search
CPC ........ H02H 9/02; H02H 1/0007; H02M 3/155
See application file for complete search history.

(56) References Cited

U.S. PATENT DOCUMENTS

| | | |
|---|---|---|
| 6,194,948 B1 | 2/2001 | Scian et al. |
| 6,933,706 B2 | 8/2005 | Shih |
| 7,906,948 B2 | 3/2011 | Qiu et al. |
| 9,712,046 B2 | 7/2017 | Sandner et al. |
| 10,855,183 B1 | 12/2020 | Barrenscheen et al. |
| 2003/0193764 A1* | 10/2003 | Ziemer ............... H02H 11/003 361/18 |
| 2012/0212159 A1* | 8/2012 | Kitamoto ............. B62D 5/0487 318/139 |
| 2012/0327547 A1* | 12/2012 | Andersson ............ H02H 3/087 361/101 |
| 2017/0033783 A1 | 2/2017 | Rahman et al. |
| 2020/0144915 A1 | 5/2020 | Mei |
| 2020/0228013 A1* | 7/2020 | Chao ...................... H02M 1/38 |
| 2022/0285927 A1 | 9/2022 | Bacigalupo et al. |

OTHER PUBLICATIONS

Stefanucci, C. et al.; "Analysis of Substrate Currents Propagation in HVCMOS technology"; 46th European Solid-State Device Research Conference; Lausanne, Switzerland, Sep. 2016; pp. 319-322.

* cited by examiner

*Primary Examiner* — Scott Bauer

(57) ABSTRACT

One example discloses a current limited power device, including: a switch; an output coupled to the switch; a sensor coupled to sense a voltage across a parasitic diode within the switch; and an output current limiter circuit coupled to reduce a output current (Iout) from the output of the power device if the voltage across the parasitic diode exceeds a threshold level.

20 Claims, 6 Drawing Sheets

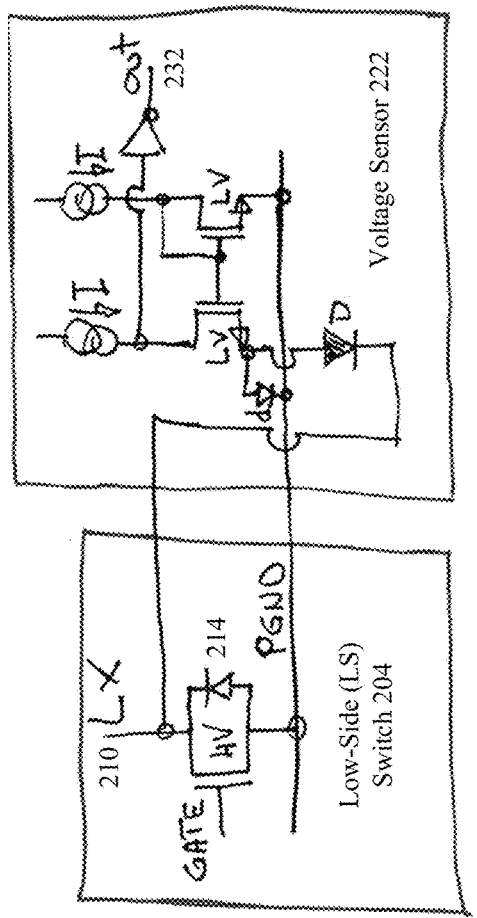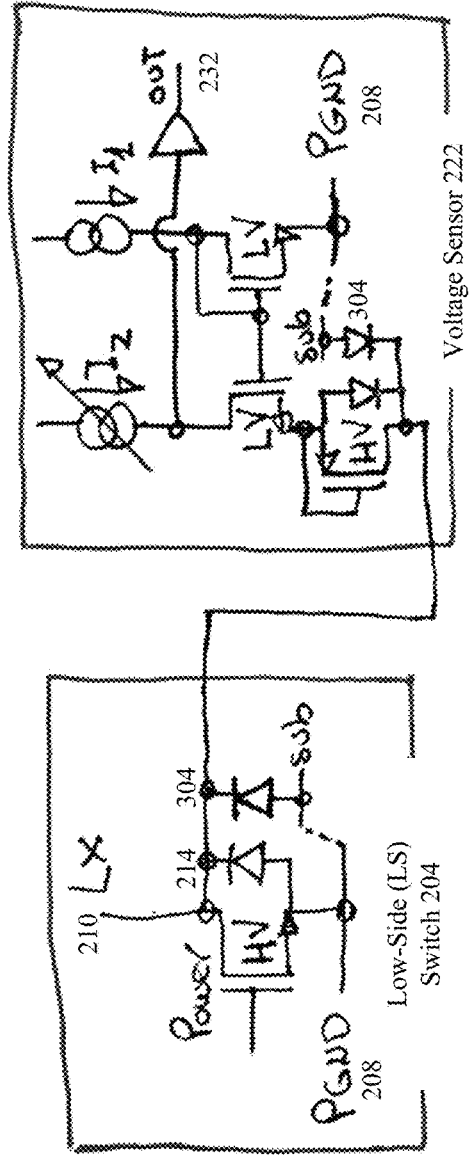
Fig. 3A
Fig. 3B

CURRENT LIMITED POWER DEVICE

The present specification relates to systems, methods, apparatuses, devices, articles of manufacture and instructions for limiting current in a power device and in its parasitic structures.

SUMMARY

According to an example embodiment, a current limited power device, comprising: a switch; an output coupled to the switch; a sensor coupled to sense a voltage across a parasitic diode within the switch; and an output current limiter circuit coupled to reduce a output current (Iout) from the output of the power device if the voltage across the parasitic diode exceeds a threshold level.

In another example embodiment, the threshold level corresponds to the parasitic device turning-on.

In another example embodiment, the output current limiter circuit decreases the output current (Iout) as a temperature of the switch increases.

In another example embodiment, the sensor is configured to generate a trigger signal if the voltage across the parasitic diode exceeds the threshold level.

In another example embodiment, further comprising an adjustable output current limit circuit coupled between the sensor and the output current limiter circuit, and configured to receive the trigger signal; and wherein the adjustable output current limit circuit is configured to increment and decrement an output current limit in response to the trigger signal.

In another example embodiment, the output current limiter circuit is configured to keep the output current (Iout) at or below the output current limit.

In another example embodiment, the adjustable output current limit circuit includes a counter driven by the trigger signal; and the counter increments and decrements the output current limit.

In another example embodiment, the adjustable output current limit circuit includes an integrator driven by the trigger signal; and the capacitor stores a charge corresponding to increments and decrements of the output current limit.

In another example embodiment, the integrator is a capacitor.

In another example embodiment, further comprising a blanking circuit coupled between the sensor and the adjustable output current limit circuit; wherein the blanking circuit is configured to prevent the trigger signal from reaching the adjustable output current limit circuit when the switch is turned-off.

In another example embodiment, the switch includes a high-side switch and a low-side switch.

In another example embodiment, the voltage is sensed at a mid-node between the high-side switch and the low-side switch.

In another example embodiment, further comprising an inductor coupled between the mid-node and the output of the power device.

In another example embodiment, the sensor is configured to sense the voltage across the parasitic diode within the low-side switch.

In another example embodiment, the sensor is configured to sense the voltage across the parasitic diode within the high-side switch.

In another example embodiment, the power device is a DCDC Buck converter.

In another example embodiment, the power device is a DCDC Boost converter.

In another example embodiment, the power device is embedded in a silicon substrate.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

BRIEF DESCRIPTION OF THE DRAWINGS

FIG. 3A is a first parasitic voltage sensing example for the current limited power device.

FIG. 3B is a second parasitic voltage sensing example for the current limited power device.

Figure 1:
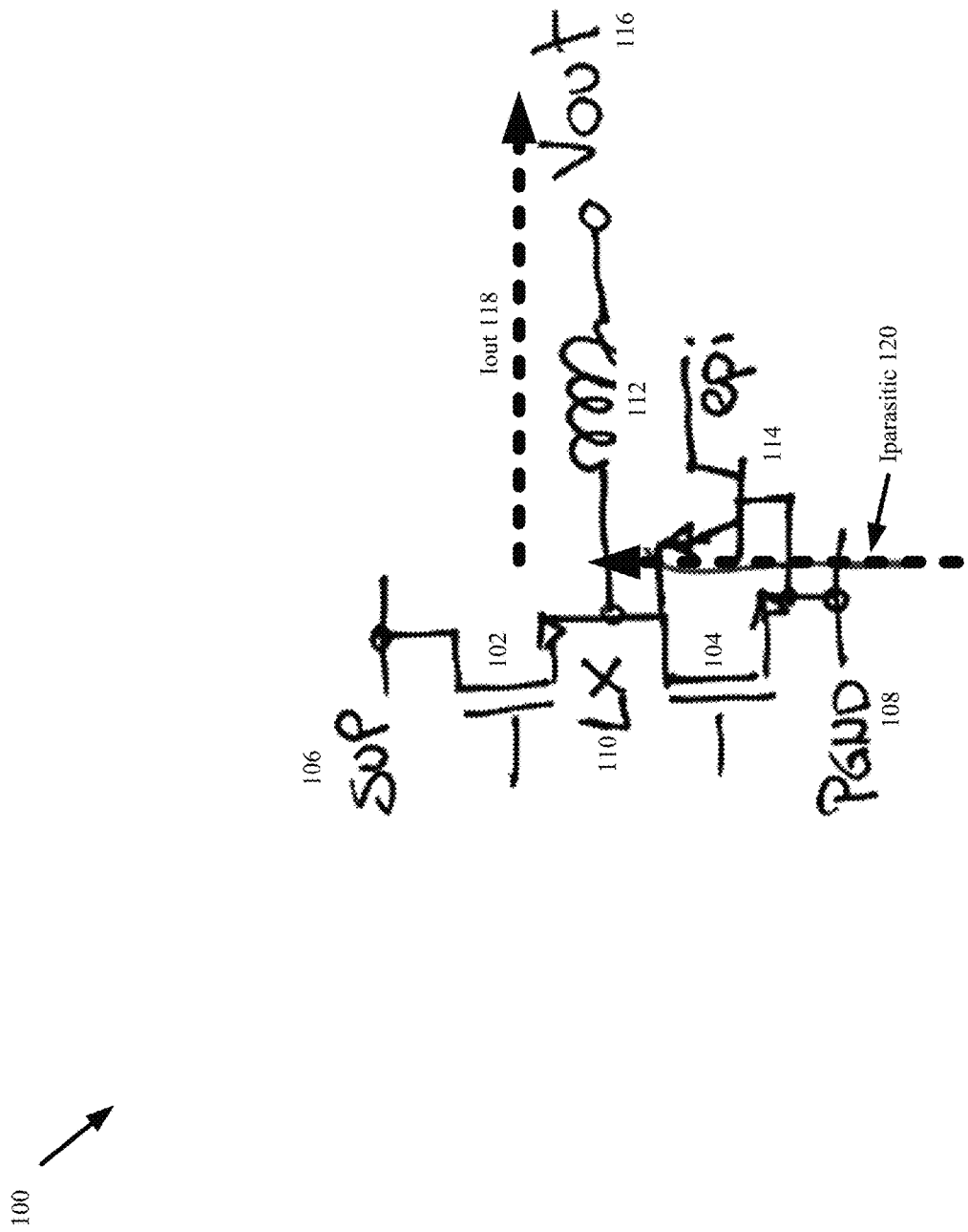
FIG. 1 represents an example power device with an NPN parasitic structure.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

FIG. 1 represents an example power device 100. The power device 100 (e.g. a "half-bridge" w/two MOSFETS) includes a high-side (HS) switch 102, a low-side (LS) switch 104, receiving a supply voltage 106 and coupled to a ground reference 108. Between the HS switch 102 and the LS switch 104 is a mid-node (LX) 110 (e.g. a switching node). The mid-node 110 is coupled to an inductor 112 configured to route an output current (Iout) 118 and present an output voltage (Vout) 116 at an output of the power device 100.

While there are many possible parasitic elements, for purposes of the discussion that follows the focus is on a parasitic bipolar 114 across the LS switch 104 that conducts a parasitic output current 120 under certain circuit operating conditions. This parasitic output current 120 is not desired and becomes part of the output current 118.

For example, in applications where the power device 100 is configured as a synchronous buck converter half bridge, the switching node (LX) 110 flies to a negative voltage (i.e. back EMF voltage) at each discharge cycle, due to the output current (Iout) 118 flowing into the inductor 112. If the low-side (LS) switch 104 is not isolated (e.g. not an SOI (silicon on insulator) switch) and this negative flyback voltage exceeds a diode threshold, then the parasitic NPN bipolar 114 is triggered and the undesired parasitic output current 120 begins to flow. A similar parasitic output current would flow if the power device 100 was configured as a synchronous boost converter half bridge, then a parasitic PNP bipolar in the HS switch 102 would be triggered.

One brute force approach to avoid triggering the parasitic bipolar 114 is to oversize the switches 102, 104. In other words, the switches 102, 104 would need to have a Ron (on resistance) small enough to avoid having mid-node (LX) 110 swinging below (or above) a diode threshold (Ron*I<Vd), including during worst-case conditions of high current conduction and high temperature.

For example, if the power device's 100 output current (Iout) 118 must be limited to a range from 1.95 A to 2.9 A, and the device's 100 max temperature can reach 200 degrees, then the power device's 100 low-side switch 104 should be sized to avoid triggering the parasitic bipolar 114 at 200 C and 2.9 A.

Calculating this, if an output current (Iout) ripple is 0.5 A, then the power device 100 should have a worst-case Ron= (700 m−175*2 m)/(2.9+½ I_ripple)~110 mOhm. Since carrier mobility derates with temperature: mobility derate~ $[(T/T0)]^{1.5}$ and if Ron is 20% larger than typical, then a calculated Ron will be about: Ron_Typical_@Room_Temperature=110/(1.2*(500/300)^(1.5))~42.5 mOhm.

The above brute force approach shows that we need a power device of ~42.5 mOhm for the power to be operative and safe up to 200 C, but from the spec tells us that if need to guarantee 1.95 A @ 125 C with the output current (Iout) ripple of 0.5 A, then the power device's 100 worst-case Ron=(700 m−100*2 m)/(1.95+½ I_ripple)~227 mOhm. Taking in to account the mobility derate with temperature and if the slow Ron is 20% larger than typical, then the calculated Ron will be about: Ron_Typical_@Room_Temperature=227/(1.2*(400/300)^(1.5))~122.8 mOhm. Hence we could use smaller devices if the max operating temperature were smaller.

However a problem with this brute force approach is that the larger the Ron, then the larger an area needed for the power device's 100 switches 102, 104.

Another approach makes use of isolated devices either using SOI (silicon on insulator) or isolating the switches 102, 140 inside a SiO2 pocket. In this kind of technology the device it is physically isolated by growing it above/inside a SiO2 pocket. No collector is present. This approach both removes the LS switch's 104 parasitic NPN and the HS switch's 102 parasitic PNP.

In another approach, guard rings on the supply voltage 106 can be used to try to avoid large power losses and minimize latch-up problems.

Also the parasitic PNP substrate current's at the HS switch 102 can be minimized by toggling the substrate body connection so as to disconnect the substrate body from the supply voltage 106.

Now discussed, are example power devices that require an area potentially 2 or 3 times smaller than the brute force approach power device 100 of FIG. 1 while still having the current capability needed by the spec at 125 C. The example power devices to be discussed thus could have an area three times smaller while still guaranteeing, for example, a current range of 1.95 A to 2.9 A over various temperature extremes specified in the parametric specification.

Usually devices are requested to be operative up to a preterminal thermal shutdown temperature (e.g. 200 C), however the parametric specification requires a guarantee of the range of current (in this case 1.95 A-2.9 A) only up to 125 C. The example power devices to be discussed optimize the power device's area to fit this parametric specification. Since above 125 C (in worst case) the maximum output current does not need to fit the parametric specification, by folding back the current limit (and avoid triggering the parasitic device), such example power devices can avoid being damaged.

These example power devices control and minimize parasitic currents flowing into a silicon substrate that hosts the power device's switches. These devices detect when parasitic elements are about to turn-on, particularly during high output (Iout) current conduction conditions. Overcurrent protection (i.e. a foldback function) is triggered at a predetermined power device temperature, and reduces an overcurrent limit in proportion to the temperature increase.

Figure 2:
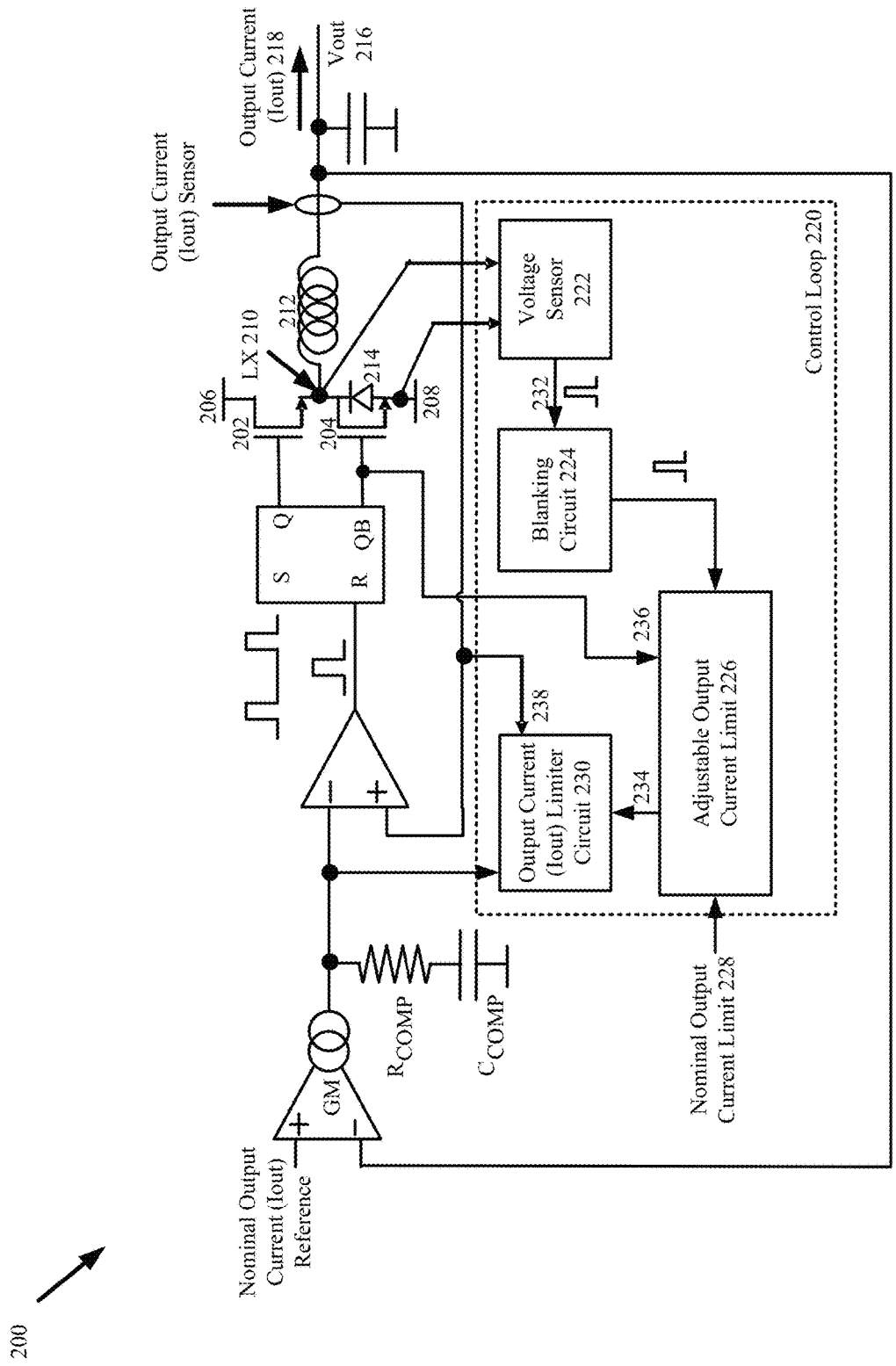
FIG. 2 is a first example current limited power device.

FIG. 2 is a first example current limited power device 200 (DCDC Buck converter). The current limited power device 200 includes a high-side (HS) switch 202, a low-side (LS) switch 204, receiving a supply voltage 206 and coupled to a ground reference 208. Between the HS switch 202 and the LS switch 204 is a mid-node (LX) 210 (e.g. a switching node). The mid-node 210 is coupled to an inductor 212 configured to route an output current (Iout) 218 and present an output voltage (Vout) 216 at an output of the power device 200.

While there are many possible parasitic elements, for purposes of the discussion that follows the focus is on a parasitic diode 214 across the LS switch 204 that conducts a parasitic output current under certain circuit operating conditions. This parasitic output current is not desired and becomes part of the output current 218.

The current limited power device 200 also includes a control loop 220. The control loop 220 includes a voltage sensor 222, a blanking circuit 224, an adjustable output current limit 226, a nominal output current limit 228, and an output current (Iout) limiter circuit 230.

The voltage sensor 222 is configured to monitor a voltage across the parasitic diode 214 (e.g. PNP, NPN, etc.) formed by the low-side (LS) switch 204 and detect when the voltage exceeds the parasitic diode's 214 threshold turn-on voltage (e.g. in response to a discharge cycle of the power device 200). Such detection is shown by a trigger signal 232.

The adjustable output current limit 226 circuit is configured to increment or decrement an output current limit 234 sent to the output current (Iout) limiter circuit 230 in response to state changes in the trigger signal 232, a low-side gate driver signal 236 (e.g. QB from the SR_latch), and the nominal output current limit 228.

In some example embodiments (e.g. digital embodiments) the adjustable output current limit 226 includes a counter driven by the trigger signal 232 from the voltage sensor 222. The counter increments or decrements the output current limit 234 based on the output of the voltage sensor 232 filtered by the blanking circuit 224, that removes spurious signals.

In other example embodiments (e.g. analog embodiments) the adjustable output current limit 226 includes an integrator (usually a capacitor) driven by the trigger signal 232 from the voltage sensor 222. The adjustable output current limit 226 increments or decrements the output current limit 234 based on a charge stored on the capacitor that is increased or decreased by the integrator based on the output of the voltage sensor 232.

The presence of an output signal out of the blanking circuit 224 (during a LS 204 on-phase) triggers a count down in the counter, causing a decrease of the current limit. The absence of any signal from the blanking circuit 224 during a LS on-phase triggers a count up in the counter till saturation is reached and the current limit reference becomes the nominal output current limit 228. In this way the parasitic current flowing in the parasitic bipolar 214 is minimized and kept under control.

The blanking circuit 224 is configured to generate a blanking signal that blocks the voltage sensor's 222 trigger signal 232 from reaching the adjustable output current limit 226 circuit when the low-side (LS) switch 204 is turned-off. The blanking signal (see FIG. 4A) begins before the low-side (LS) switch 204 is about to turn-off, and ends after the low-side (LS) switch 204 gate voltage from the QB pin of the SR-latch has reached a nominal gate voltage (i.e. an LS turn-on time 418).

Thus the blanking circuit's 224 blanking signal masks any false trigger signals 232 from the voltage sensor 222. A duration of the blanking signal 408 filtering time should be longer than a maximum dead time 414 possible and preferably longer than the maximum time needed to the LS power switch 204 to be fully driven (i.e. an LS turn-on time).

The output current (Iout) limiter circuit 230 is configured to compare the output current (Iout) 218 using an output current sense signal 238 from an output current (Iout) sensor to the output current limit 234 signal. If the output current sense signal 238 is greater than the output current limit 234 then the output current (Iout) limiter circuit 230 sinks current output by a GM source (as shown) and thus lower the output current (Iout) 218 in order to avoid having large currents flowing the parasitic diode 214. As a result, the output current (Iout) 218 is kept at or below the output current limit 234.

In alternate embodiments, the current limit control can be configured to act directly on the logic and switch off the HS as soon as the current limit it is triggered. This can be done with controls loop done in a different ways, usually hysteretic or without Ccomp integrator.

Using the control loop 220, the current limited power device 200 can dynamically respond to increases in temperature that lower the parasitic diode's 214 threshold turn-on voltage, so as to keep the parasitic output current minimized. The control loop 220 thus automatically reduces the output current (Iout) 218 as temperature increases providing a fold-back effect. In some example embodiments, the output current (Iout) 218 reduction will be linear with the temperature, being controlled by the parasitic diode's 214 threshold, which decreases ~2 mV/C.

FIG. 3A is a first parasitic voltage sensing example 300 for the current limited power device 200. In this example 300 just the interface between the low-side (LS) switch 204 and the voltage sensor 222 is shown. Diode (D) is a sensing diode in the voltage sensor 222.

As soon as a current (ID) flowing in D detects that the parasitic BD_diode 214 is about to turn-on, the voltage sensor 222 outputs the trigger signal 232. The current flowing in D in various example embodiments will be a fraction of the current (ID) flowing in the parasitic diode 214 (e.g. body-drain diode) and will depend on the diodes area ratio: ID=(D_diode_area/BD_diode_area)*IBD_diode. In some example embodiments, a second diode could be added to clamp the source of the LS switch 204, in order to avoid damaging it.

FIG. 3B is a second parasitic voltage sensing example 302 for the current limited power device 200. In this example 302 the interface between the low-side (LS) switch 204 and the voltage sensor 222 is also shown. In some example embodiments, the sensing diode (D) is closely matched with the parasitic diode 214 in the low-side (LS) switch 204 to improve temperature matching. In this example 302 a parasitic substrate (e.g. body-drain) diode 304 is also shown and the sensing diode (D) current will monitor both diodes 214, 304. In order to minimize the current flowing into the parasitic substrate (e.g. body-drain) diode 304 a substrate connection to PGND 208 should be more ohmic than a connection of the LS Switch Source pin to a same pad.

Figure 4A:
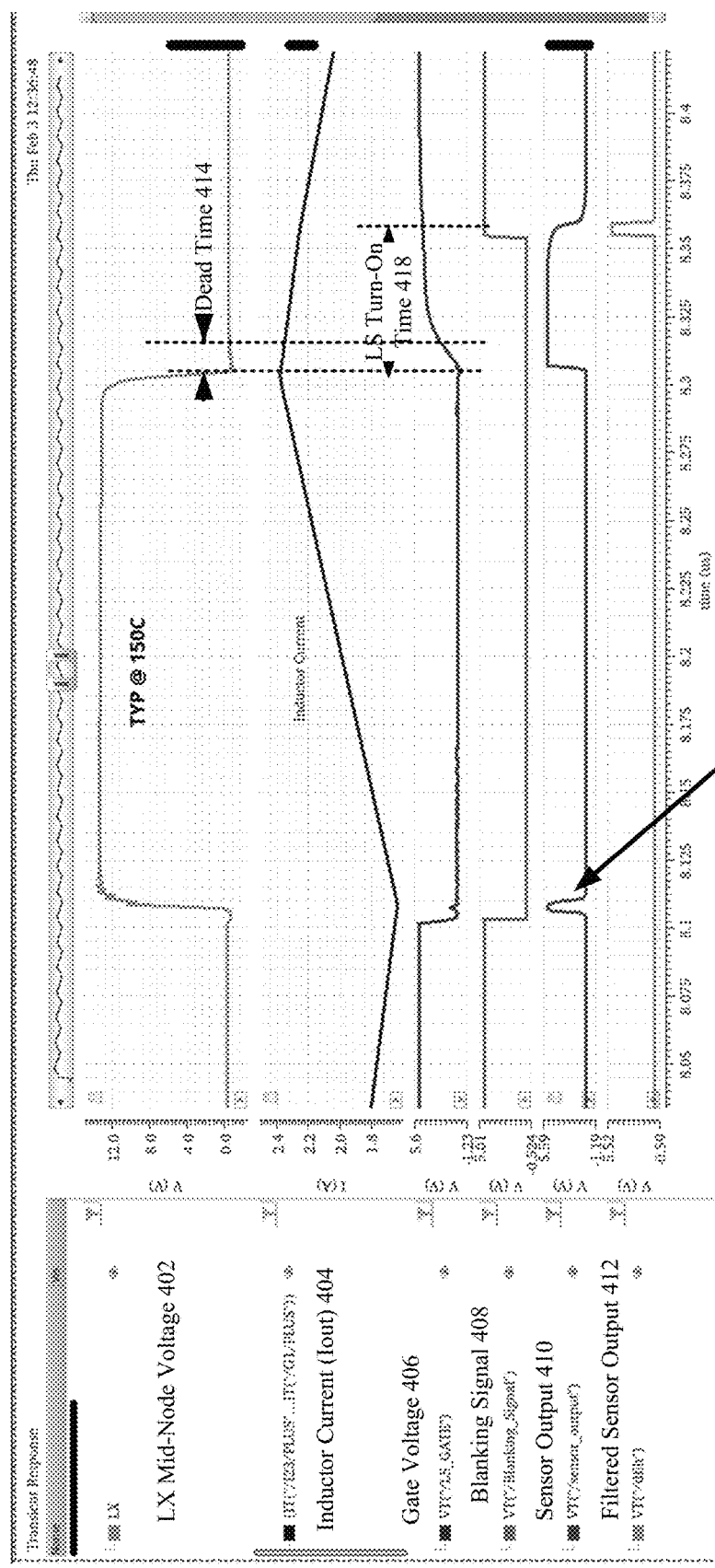
FIG. 4A represents a first example set of waveforms for the current limited power device.

FIG. 4A represents a first example set of waveforms 400 for the current limited power device 200. The first waveforms 400 correspond to operation of the first example current limited power device 200 and include: the LX mid-node 210 voltage 402, inductor 212 current (Iout) 404, LS switch 204 gate voltage 406 from OB pin of the SR-latch, a blanking signal 408 generated by the blanking circuit 224, a sensor output signal 410 from the voltage sensor 222, and a filtered sensor output signal 412 output by the blanking circuit 224.

A dead time 414 when both the low-side (LS) switch 204 and the high-side (HS) switch are off and a LS switch 204 turn-on time 418 is shown in FIG. 4A, as is a spurious voltage sensor 222 output 410 signal 416. As introduced above, the output 410 of the voltage sensor 222 needs to be blanked during the dead time 414 and till the LS gate it is fully driven, in order to avoid generating a false trigger signal 232. The duration of the blanking signal 408 filtering time should be longer than a maximum dead time 414 possible and preferably longer than the maximum time needed to the LS power switch 204 to be fully driven (i.e. the LS turn-on time 418).

Figure 4B:
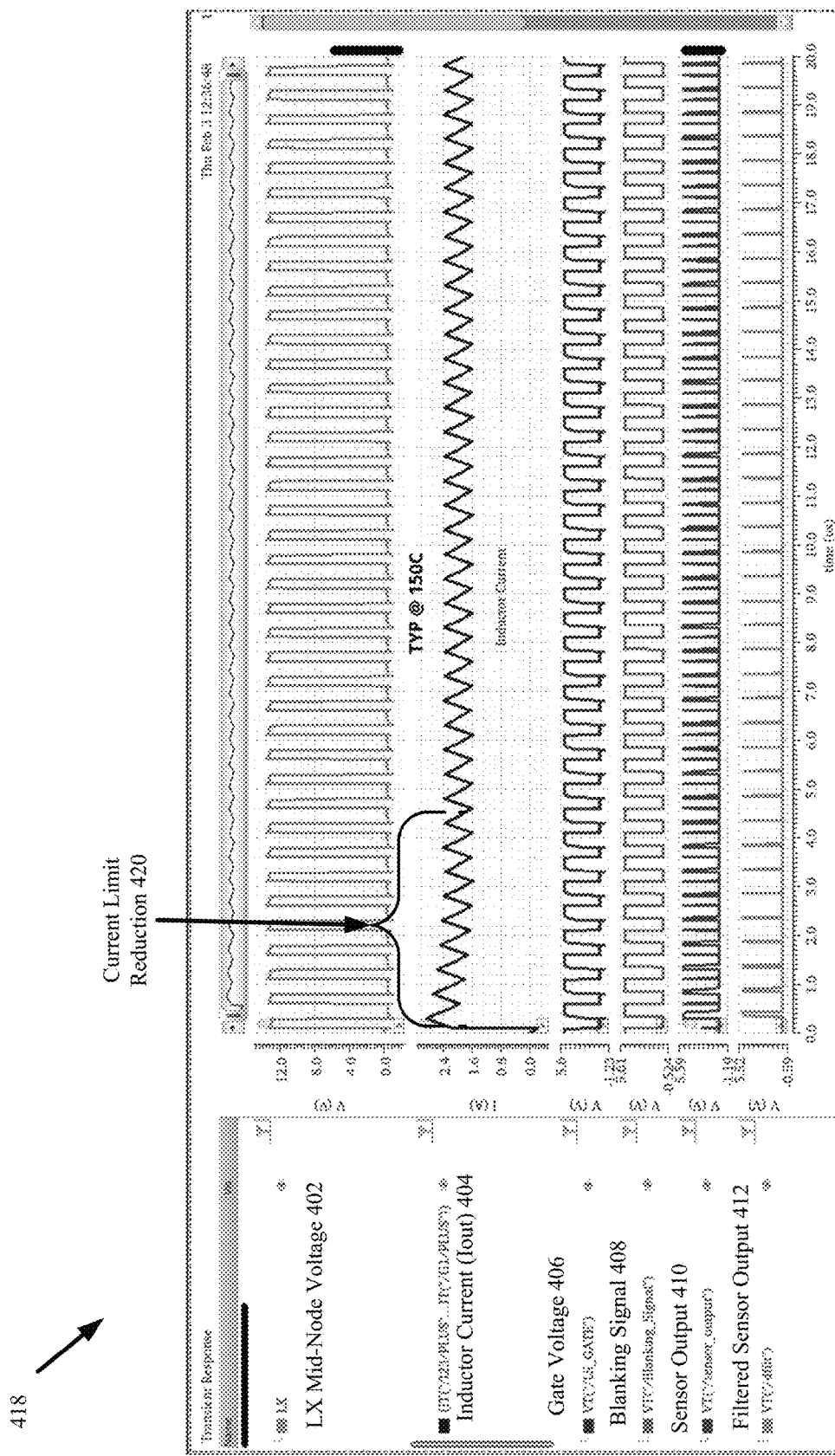
FIG. 4B represents a second example set of waveforms for the current limited power device.

FIG. 4B represents a second example set of waveforms 418 for the current limited power device 200. A same set of waveforms are shown as for the first example set of waveforms 400; however, a range of time shown has increased so that a current limit reduction 420 generated and modulated by the current limited power device 200 can be better viewed.

As shown, the Iout current 404 starts with a larger maximum current that the control loop 220 reduces so as to minimize the parasitic diode's 214 turn-on time.

Figure 5:
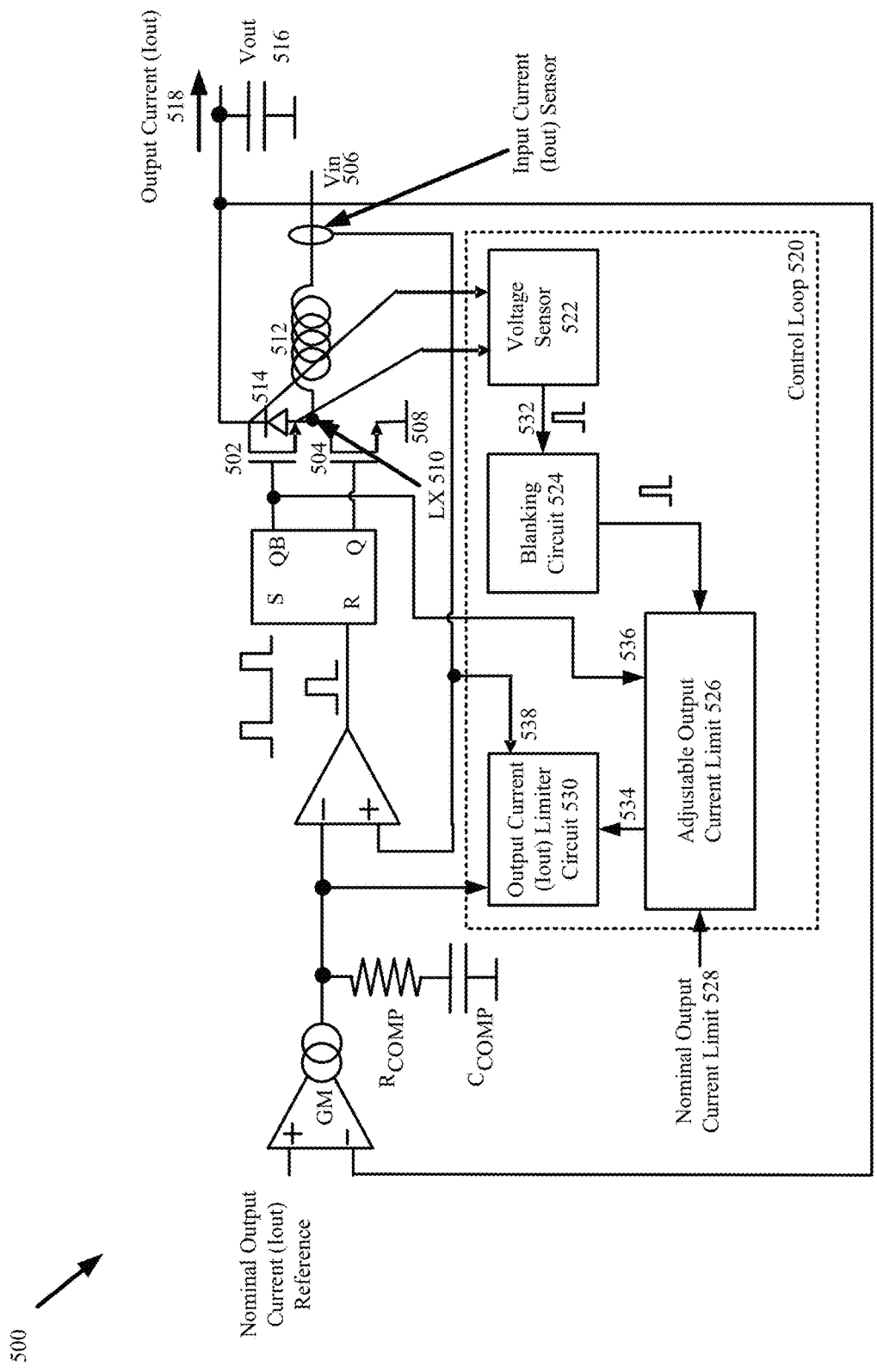
FIG. 5 represents a second example current limited power device.

FIG. 5 represents a second example current limited power device 500 (DCDC Boost converter). The second current limited power device 500 includes a high-side (HS) switch 502, a low-side (LS) switch 504, receiving a supply voltage 506 and coupled to a ground reference 508. Between the HS switch 502 and the LS switch 504 is a mid-node (LX) 510 (e.g. a switching node). The mid-node 510 is coupled to an inductor 512 which is itself coupled to receive the supply voltage 506. The HS switch 502 is configured to route an output current (Iout) 518 and present an output voltage (Vout) 516 at an output of the power device 500.

While there are many possible parasitic diodes, capacitance and such, for purposes of the discussion that follows the focus is on a parasitic diode 514 across the HS switch 502 that conducts a parasitic output current under certain circuit operating conditions. This parasitic output current is not desired and becomes part of the output current 518.

The current limited power device 500 also includes a control loop 520. The control loop 520 includes a voltage sensor 522, a blanking circuit 524, an adjustable output current limit 526, a nominal output current limit 528, and an output current (Iout) limiter circuit 530.

The voltage sensor 522 is configured to monitor a voltage across the parasitic diode 514 (e.g. PNP, NPN, etc.) formed by the high-side (HS) switch 502 and detect when the voltage exceeds the parasitic diode's 514 threshold turn-on voltage (e.g. in response to a charge cycle of the power device 500). Such detection is shown by a trigger signal 532.

The output current limit 534 signal, low-side gate driver signal 536, and output current sense signal 538 operate in a manner similar but symmetrical to that discussed with respect to FIG. 2. Thus the second example current limited power device 500 is substantially the same as the first current limited power device 200, except instead of being a DCDC Buck converter, the second current limited power device 500 is in a DCDC Boost converter configuration.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A current limited power device, comprising:
a switch;
an output coupled to the switch;
a sensor coupled to sense a voltage across a parasitic diode within the switch; and
an output current limiter circuit coupled to reduce an output current (Iout) from the output of the power device if the voltage across the parasitic diode exceeds a threshold level.

2. The device of claim 1:
wherein the threshold level corresponds to the parasitic device turning-on.

3. The device of claim 1:
wherein the output current limiter circuit decreases the output current (Iout) as a temperature of the switch increases.

4. The device of claim 1:
wherein the sensor is configured to generate a trigger signal if the voltage across the parasitic diode exceeds the threshold level.

5. The device of claim 4:
further comprising an adjustable output current limit circuit coupled between the sensor and the output current limiter circuit, and configured to receive the trigger signal; and
wherein the adjustable output current limit circuit is configured to increment and decrement an output current limit in response to the trigger signal.

6. The device of claim 5:
wherein the output current limiter circuit is configured to keep the output current (Iout) at or below the output current limit.

7. The device of claim 5:
wherein the adjustable output current limit circuit includes a counter driven by the trigger signal; and
wherein the counter increments and decrements the output current limit.

8. The device of claim 5:
wherein the adjustable output current limit circuit includes an integrator driven by the trigger signal; and
wherein the capacitor stores a charge corresponding to increments and decrements of the output current limit.

9. The device of claim 8:
wherein the integrator is a capacitor.

10. The device of claim 5:
further comprising a blanking circuit coupled between the sensor and the adjustable output current limit circuit;
wherein the blanking circuit is configured to prevent the trigger signal from reaching the adjustable output current limit circuit when the switch is turned-off.

11. The device of claim 1:
wherein the switch includes a high-side switch and a low-side switch.

12. The device of claim 11:
wherein the voltage is sensed at a mid-node between the high-side switch and the low-side switch.

13. The device of claim 12:
further comprising an inductor coupled between the mid-node and the output of the power device.

14. The device of claim 11:
wherein the sensor is configured to sense the voltage across the parasitic diode within the low-side switch.

15. The device of claim 11:
wherein the sensor is configured to sense the voltage across the parasitic diode within the high-side switch.

16. The device of claim 1:
wherein the power device is a DCDC Buck converter.

17. The device of claim 1:
wherein the power device is a DCDC Boost converter.

18. The device of claim 1:
wherein the power device is embedded in a silicon substrate.

19. A current limited power device, comprising:
a switch;
an output coupled to the switch;
a sensor coupled to sense a voltage across a parasitic diode within the switch; and
an output current limiter circuit coupled to reduce a output current (Iout) from the output of the power device if the voltage across the parasitic diode exceeds a threshold level;

wherein the sensor is configured to generate a trigger signal if the voltage across the parasitic diode exceeds the threshold level;
an adjustable output current limit circuit coupled between the sensor and the output current limiter circuit, and configured to receive the trigger signal;
wherein the adjustable output current limit circuit is configured to increment and decrement an output current limit in response to the trigger signal.

20. A current limited power device, comprising:
a switch;
an output coupled to the switch;
a sensor coupled to sense a voltage across a parasitic diode within the switch; and
an output current limiter circuit coupled to adjust an output current limit of the power device if the voltage across the parasitic diode exceeds a threshold level.

* * * * *